United States Patent
Adam et al.

(10) Patent No.: US 8,372,705 B2
(45) Date of Patent: Feb. 12, 2013

(54) FABRICATION OF CMOS TRANSISTORS HAVING DIFFERENTIALLY STRESSED SPACERS

(75) Inventors: Lahir Shaik Adam, Wappingers Falls, NY (US); Sanjay C Mehta, Niskayuna, NY (US); Balasubramanian S Haran, Watervliet, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 13/013,801

(22) Filed: Jan. 25, 2011

(65) Prior Publication Data

US 2012/0187482 A1    Jul. 26, 2012

(51) Int. Cl.
*H01L 21/8238* (2006.01)

(52) U.S. Cl. ........ 438/199; 438/275; 438/289; 438/303; 438/305; 257/357; 257/900; 257/E21.435

(58) Field of Classification Search .......... 438/197, 438/199, 217, 275, 276, 289, 301, 303, 305, 438/FOR. 163, FOR. 424; 257/357, 900, 257/E21.435
See application file for complete search history.

(56) References Cited

U.S. PATENT DOCUMENTS

| | | | |
|---|---|---|---|
| 6,074,906 A | 6/2000 | Cheek | |
| 7,202,187 B2* | 4/2007 | Ramachandran et al. | 438/791 |
| 7,303,949 B2 | 12/2007 | Chen | |
| 7,554,156 B2* | 6/2009 | Harada et al. | 257/344 |
| 7,776,732 B2* | 8/2010 | Chang et al. | 438/595 |
| 7,968,964 B2* | 6/2011 | Bui et al. | 257/447 |
| 8,242,555 B2* | 8/2012 | Hanafi | 257/328 |
| 2005/0082605 A1* | 4/2005 | Akasaka | 257/329 |
| 2005/0287823 A1* | 12/2005 | Ramachandran et al. | 438/791 |
| 2006/0186557 A1 | 8/2006 | Shima | |
| 2006/0220113 A1 | 10/2006 | Tamura | |
| 2008/0001182 A1 | 1/2008 | Chen | |
| 2009/0045466 A1 | 2/2009 | Nakamura | |

* cited by examiner

*Primary Examiner* — Thanh V Pham
(74) *Attorney, Agent, or Firm* — Louis J. Percello; Robert M. Trepp

(57) ABSTRACT

CMOS transistors are formed incorporating a gate electrode having tensely stressed spacers on the gate sidewalls of an n channel field effect transistor and having compressively stressed spacers on the gate sidewalls of a p channel field effect transistor to provide differentially stressed channels in respective transistors to increase carrier mobility in the respective channels.

13 Claims, 4 Drawing Sheets

FABRICATION OF CMOS TRANSISTORS HAVING DIFFERENTIALLY STRESSED SPACERS

BACKGROUND

The present invention relates to CMOS transistors, and more specifically, to n and p channel metal oxide semiconductor (MOS) field effect transistors (FET's) having differentially stressed spacers and differentially stressed channels.

Stressor layers have been one of the techniques used to increase device performance. However, due to the location of the spacers for short channel effect control, the stressor layers are typically located a few hundred angstroms away from the channel over a spacer thereby limiting the extent of performance improvement in carrier mobility in the channel.

BRIEF SUMMARY OF THE INVENTION

In accordance with the present invention, a method for forming n and p field effect transistors is described comprising selecting a substrate having p and n regions for forming n and p field effect transistors respectively therein, forming a first gate dielectric and a first poly silicon gate electrode having sidewalls on at least one p region, forming a second gate dielectric and a second poly silicon gate electrode having sidewalls on at least one n region, forming a first hard mask over the second gate dielectric, the second poly silicon gate electrode and the n region, forming a tensely stressed film over the first poly silicon gate electrode, etching the tensely stressed film to provide a tensely stressed spacer on the sidewalls of the first poly silicon gate electrode, forming a n type halo region in the p region on opposite sides of the first poly silicon gate electrode, forming a n type source and drain extension in the p region overlapping the n type halo regions on opposite sides of the first poly silicon gate electrode, removing the first mask, forming a second mask over the p region, n type source and drain extensions, n type halo regions, tensile stressed spacers and first poly silicon gate electrode, forming a compressively stressed film over the second poly silicon gate electrode, etching the compressively stressed film to provide a compressively stressed spacer on the sidewalls of the second poly silicon gate electrode, forming a p type halo region in the n region on opposite sides of the second poly silicon gate electrode, forming a p type source and drain extension in the n region overlapping the p type halo regions on opposite sides of the second poly silicon gate electrode, and removing the second mask.

The invention further provides a n type field effect transistor comprising a substrate having a p region, a first gate dielectric, a first poly silicon gate electrode there over having sidewalls, a tensely stressed spacer on the sidewalls of the first poly silicon gate electrode, a n type halo region in the p region on opposite sides of the first poly silicon gate electrode, a n type source and drain extension overlapping the n type halo regions on opposite sides of the first poly silicon gate electrode, and electrical contacts to the source extension, drain extension and gate electrode.

The invention further provides a p type field effect transistor comprising a substrate having a n region, a first gate dielectric, a first poly silicon gate electrode there over having sidewalls, a compressively stressed spacer on the sidewalls of the first poly silicon gate electrode, a p type halo region in the n region on opposite sides of the first poly silicon gate electrode, a p type source and drain extension overlapping the p type halo regions on opposite sides of the first poly silicon gate electrode, and electrical contacts to the source extension, drain extension and gate electrode.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which.

DETAILED DESCRIPTION

Figure 1:
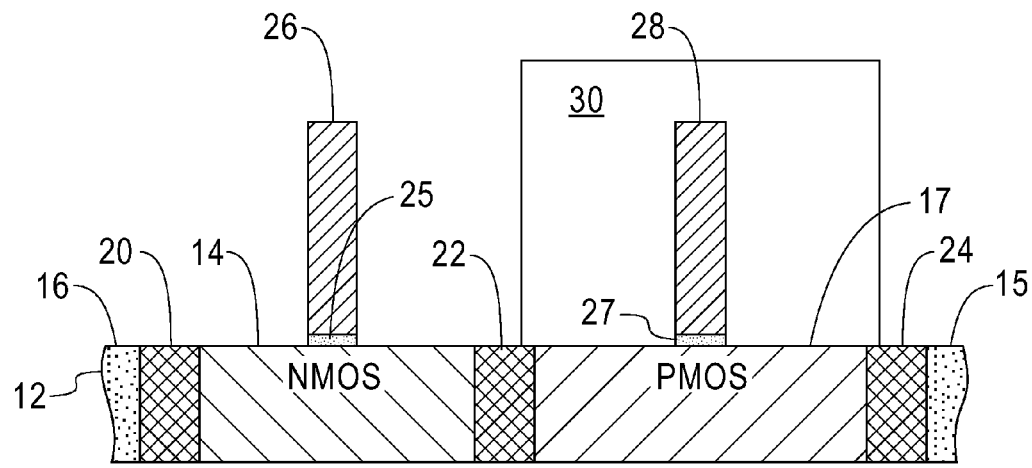
FIG. 1 is a cross-section view illustrating a process step of the invention showing a substrate having p and n regions with a respective gate dielectric and a poly silicon gate electrode thereon.

Referring now to the drawing, FIG. 1 shows a cross-section view of a semiconductor substrate 12 having p regions 14 and 15 for forming a n type metal oxide semiconductor (NMOS) field effect transistor (FET) and n regions 16 and 17 for forming a p type metal oxide semiconductor (PMOS) FET respectively therein. N region 16 and p region 14 are electrically isolated from each other by an isolation trench 20 of dielectric such as an oxide. P region 14 and n region 17 are electrically isolated from each other by an isolation trench 22 of dielectric such as an oxide. N region 17 and p region 15 are electrically isolated from each other by an isolation trench 24 of dielectric such as an oxide. P regions 14 and 15 and n regions 16 and 17 may be single crystal Si, SiGe, SiC, Ge, GaAs and combinations thereof and typically with respect to a top view, regions 14-17 have a square or rectangular shape.

A first gate dielectric 25 and first poly silicon gate electrode 26 are formed on p region 14. A second gate dielectric 27 and second poly silicon gate electrode 28 is formed on n region 17. First poly silicon gate electrode 26 and second poly silicon gate 28 may be doped n or p type up to $5 \times 10^{21}$ atoms/cm$^3$. For p type doping, $BF_2$ or $BF_3$ may be used. For n type doping, an As containing gas may be used.

A first hard mask 30 which may be for example an oxide, a nitride such as a silicon nitride or an oxide nitride is formed over n region 17, over second gate dielectric 27 and second poly silicon gate electrode 28. First hard mask 30 functions to protect n region 17, second gate dielectric 27 and second poly silicon gate electrode 28 from damage during processing in p region 14. As shown in FIG. 1, first hard mask 30 completely covers n region 17 and overlaps isolation trenches 22 and 24 which together surround and electrically isolate p region 17. A mask comprising photo resist may be used in certain situations in place of first hard mask 30.

Figure 2:
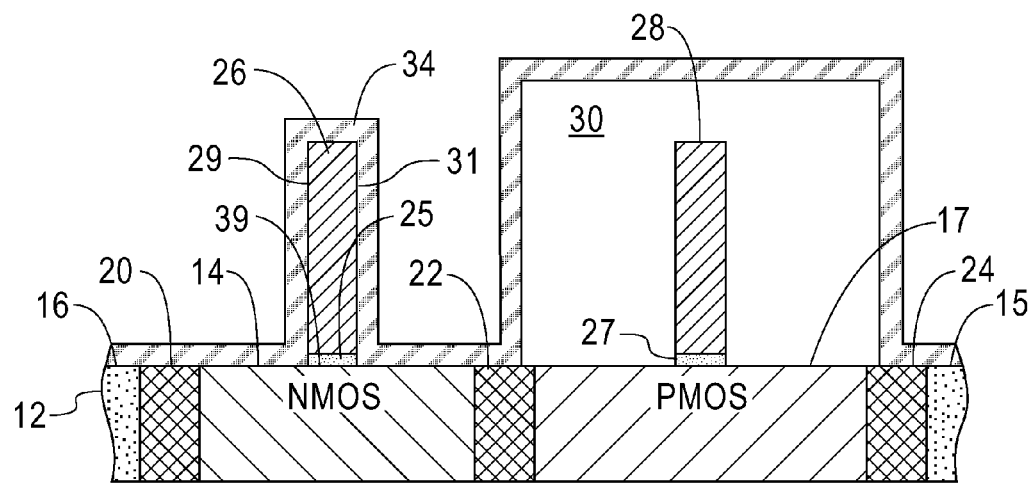
FIG. 2 is a cross-section view illustrating a process step of the invention showing a tensely stressed film on a poly silicon gate electrode on a p region.

FIG. 2 shows a cross section view of tensely stressed film 34 formed over n region 16, isolation trench 20, p region 14, first gate dielectric 25, first poly silicon gate electrode 26, isolation trench 22, mask 30, isolation trench 24 and p region 15. Tensely stressed film 34 may be a conformal coating having a thickness in the range from 2 nm to 15 nm formed of oxide nitride, nitride oxide and under conditions to provide a tensile stress on sidewalls 29 and 31 of first poly silicon gate electrode 26 which in turn provides a tensile stress in channel 39 in p region 14 underneath first gate dielectric 25 and first poly silicon gate electrode 26. Channel 39 will function as the channel of NMOS FET 86 shown in FIG. 6.

Figure 3:
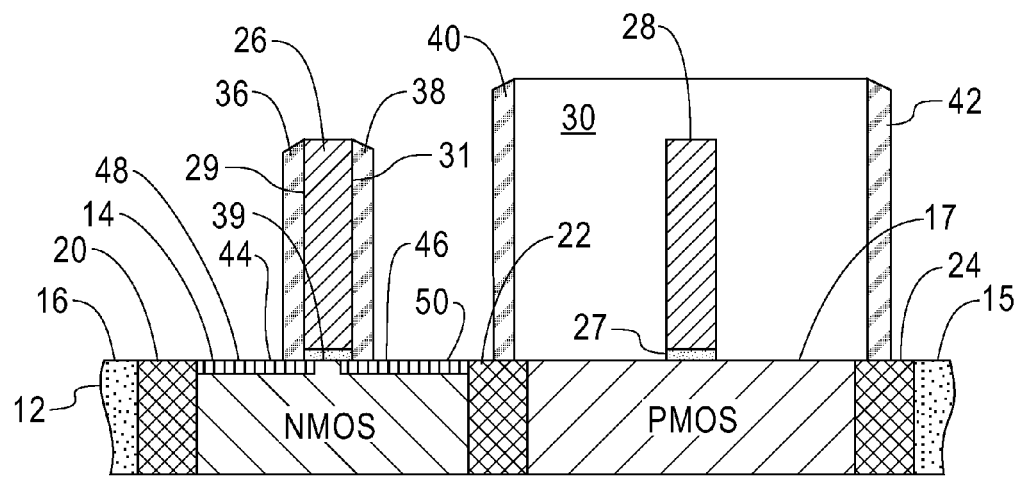
FIG. 3 is a cross-section view illustrating a process step of the invention showing a tensely stressed spacer on the sidewalls of a poly silicon gate electrode of a NMOS FET.

FIG. 3 is a cross-section view of FIG. 2 after etching tensely stressed film 34 to form tensely stressed spacers 36 and 38 on sidewalls 29 and 31 of first poly silicon gate electrode 26. Tensely stressed spacers 36 and 38 may be formed directly on sidewalls of first poly silicon gate electrode 26 and function to tensely stress poly silicon gate electrode 26 in the out of plane direction with respect to the major surface of substrate 12. In turn, tensely stressed poly silicon gate electrode 26 provides tensile stress to channel 39 directly below gate electrode 26. Tensely stressing channel 39 improves electron carrier mobility in channel 39. Tensely stressed spacers 40 and 42 are also formed on the sidewalls of mask 30 at the same time spacers 36 and 38 are formed. Tensely stressed film 34 is preferably etched by Reactive Ion Etching (REI) which etches horizontal surfaces (i.e. parallel with respect to the major surface of substrate 12) and the top edges of vertical layers. It is noted that tensely stressed film 34 is completely etched on the horizontal surfaces of mask 30 which facilitates the removal of mask 30 during later processing.

After tensely stressed spacers 36 and 38 are formed; n type halo regions 44 and 46 are formed on opposite sides of first poly silicon gate electrode 26. Halo regions 44 and 46 are positioned with respect to tensely stressed spacers 36 and 38. Next, n type source and drain extensions 48 and 50 are formed in p region 14 overlapping the halo regions on opposite sides of first poly silicon gate electrode 26. Next, hard mask 30 is removed by a chemical etch for example by a timed chemical etch. Tensely stressed spacers 40 and 42 on either side of mask 30 are removed when mask 30 is removed.

Figure 4:
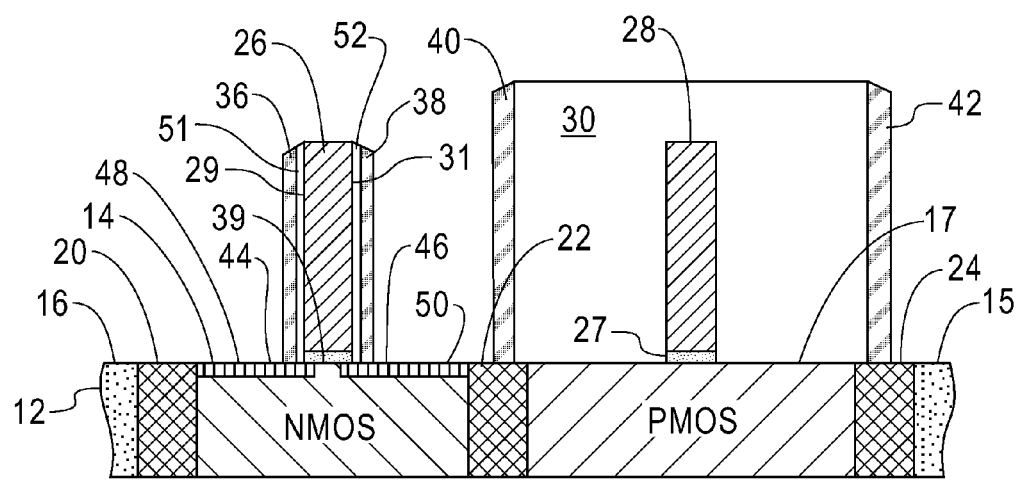
FIG. 4 is a cross-section view illustrating an alternate process of the invention showing an oxide layer formed between a tensely stressed spacer and a first poly silicon gate electrode of a NMOS FET.

FIG. 4 is a cross-section view similar to FIG. 3 except oxide layers 51 and 52 are formed first on sidewalls 29 and 31 of first poly silicon gate electrode 26 prior to forming tensely stressed film 34. Oxide layers 51 and 52 may be formed by oxidizing the exposed surface of first poly silicon gate electrode 26. Oxide layers 51 and 52 have a thickness in the range from 0.5 nm to 5 nm and are preferably in the range from 1 nm to 3 nm. Oxide layers 51 and 52 results from processing other areas on substrate 12 without a protective mask over sidewalls 29 and 31 or is formed to promote adhesion to sidewalls 29 and 31 of first poly silicon gate electrode 26 of subsequently formed tensely stressed spacers 36 and 38.

Figure 5:
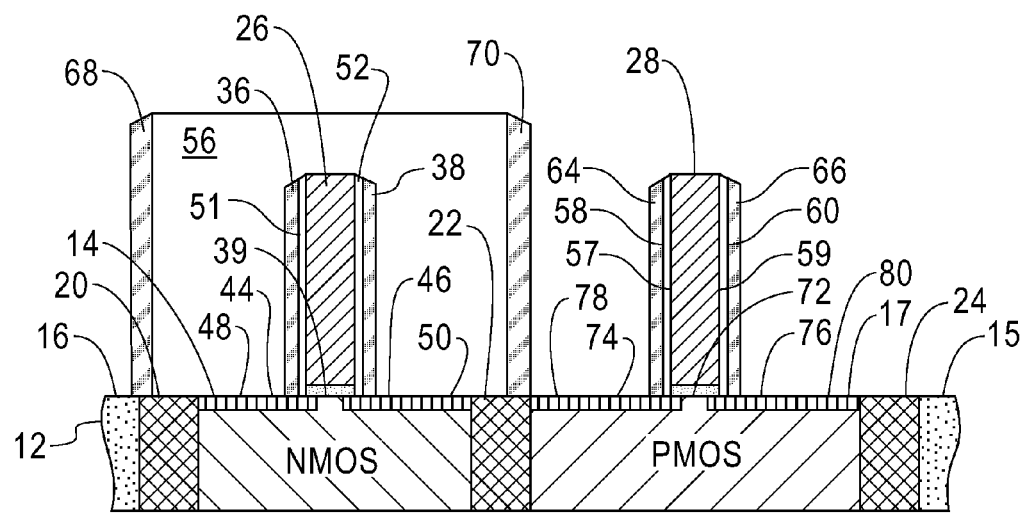
FIG. 5 is a cross-section view illustrating a process step of the invention showing an oxide layer and a compressively stressed spacer on the sidewalls of a gate electrode of a PMOS FET.

FIG. 5 is a cross-section view of FIG. 4 after removal of mask 30 to expose region 17 and second poly silicon gate electrode 28 to further processing. A mask 56 is formed over p region 14, source and drain extensions 48 and 50, halo regions 44 and 46, spacers 36 and 38, oxide layers 51 and 52, and first poly silicon gate electrode 26 to protect them from damage during processing in n region 17 to form PMOS FET 88 shown in FIG. 6.

FIG. 5 shows oxide layers 58 and 60 formed on sidewalls 57 and 59 of second poly silicon gate electrode 28. Oxide layers 58 and 60 may be formed by oxidizing the exposed surface of second poly silicon gate electrode 28. Oxide layers 58 and 60 may have a thickness in the range from 0.5 nm to 5 nm and preferably in the range from 1 nm to 3 nm. A compressively stressed film (not shown) is formed over mask 56, region 17, oxide layers 58 and 60 and second poly silicon gate electrode 28. The compressively stressed film (not shown) is etched by RIE to form compressively stressed spacers 64 and 66 on oxide layers 58 and 60 on sidewalls 57 and 59 respectively of second poly silicon gate electrode 28.

Compressively stressed spacers 68 and 70 are also formed on mask 56 at the same time compressively stressed spacers 64 and 66 are formed. Compressively stressed spacers 64 and 66 function to compress sidewalls 57 and 59 of second poly silicon gate electrode 28 and channel 72 below which improves the carrier mobility of channel 72 below shown in FIG. 5 with respect to hole carriers. Compressively stressed spacers 64 and 66 also function to position during ion implantation halo regions 74 and 76 and source/drain extensions 78 and 80 with respect to second poly silicon gate electrode 28.

After compressively stressed spacers 64 and 66 are formed, p type halo regions 74 and 76 are formed on opposite sides of second poly silicon gate electrode 28. Next, p type source and drain extensions 78 and 80 are formed overlapping halo regions 74 and 76 on opposite sides of second poly silicon gate electrode 28.

Figure 6:
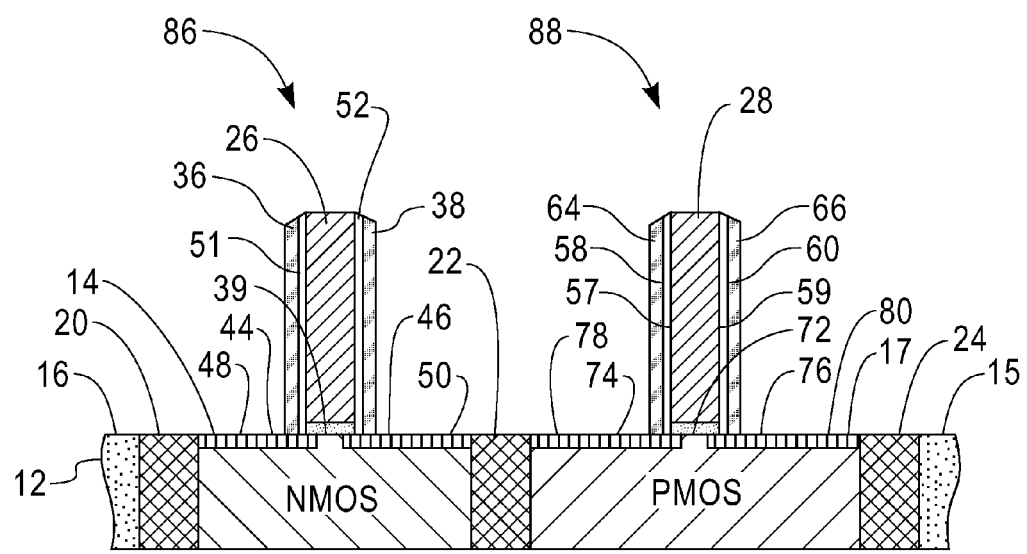
FIG. 6 is a cross-section view showing a completed NMOS FET and a PMOS FET after removal of a mask shown in FIG. 5.

FIG. 6 is a cross-section view of completed NMOS FET 86 and PMOS FET 88 after mask 56 is removed. Hard mask 56 may be removed by a chemical etch for example by a timed chemical etch. Compressively stressed spacers 68 and 70 on either side of mask 56 are removed at the same time mask 56 is removed.

Figure 7:
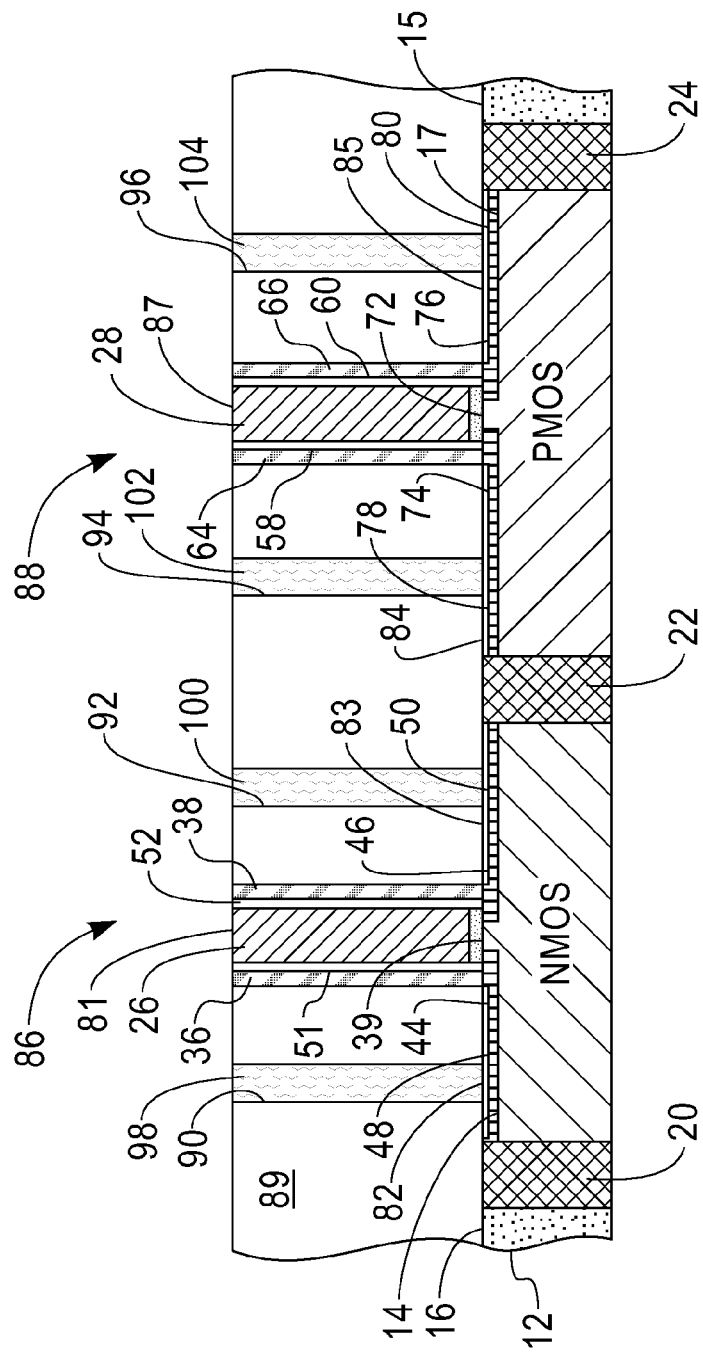
FIG. 7 is a cross-section view showing electrical contacts to the source and drain of the completed NMOS FET and PMOS FET shown in FIG. 6.

A self aligned silicide process may be used to form silicide regions 82-85 in source extension 48/halo region 44, drain extension 50/halo region 46, source extension 78/halo region 74 and drain extension 80/halo region 76, respectively, shown in FIG. 7. In the silicide process a layer of metal (not shown) is formed over substrate 12 and exposed silicon regions 14 and 17 shown in FIG. 6. The layer of metal which may be, for example, Ni (not shown) is heated and reacted with the exposed Si regions to form nickel silicide. The unreacted metal is removed by a selective etch. Nickel silicate forms an ohmic contact to source extensions 48, 50, 78 and 80 and halo regions 44, 46, 74 and 76. The metal may react with the upper surface of first and second poly silicon gate electrodes 26 and 28 to form silicide regions which are not shown in FIG. 7. The upper surface may be lowered and silicide regions removed (if present) on poly silicon gate electrodes 26 and 28 during chemical mechanical processing (CMP).

FIG. 7 is a cross-section view showing electrical contacts to source extension 48 and drain extension 50 of NMOS FET 86 and to source extension 78 and drain extension 80 of PMOS FET 88. Dielectric layer 89 may be formed over NMOS FET 86 and PMOS FET 88 which may be planarized by CMP to expose upper surface 81 and 87 respectively of first and second poly silicon gate electrodes 26 and 28 for making electrical contact thereto or for removal of first and second poly silicon gate electrodes 26 and 28 such as by chemical etching in a replacement gate process to replace the material of the respective gate dielectric and gate electrode or just the gate electrode which may be replaced with poly silicon or metal. The gate dielectric may be replaced with a gate dielectric known in the art. If silicide regions are formed on upper surface 81 and 87 respectively of first and second poly silicon gate electrodes 26 and 28, the silicide regions may be removed by CMP or remain after CMP by discontinuing CMP at the proper time before removal of the silicide regions.

Openings 90, 92, 94 and 96 may be formed in dielectric layer 89 to source extension 48, drain extension 50, source extension 78, and drain extension 80, respectively. Openings 90, 92, 94 and 96 may be filled with a conductor such as W to form contacts 98 and 100 to source extension 48 and drain extension 50 respectively of NMOS FET 86 and form contacts 102 and 104 to source extension 78 and drain extension 80 respectively of PMOS FET 88.

In FIGS. 2-7, like references are used for similar structure or apparatus shown in an earlier figure.

While there has been described and illustrated a method for forming n and p channel MOS FETs having differentially stressed spacers and transistor channels, it will be apparent to those skilled in the art that modifications and variations are possible without deviating from the broad scope of the invention which shall be limited solely by the scope of the claims appended hereto.

What is claimed is:

1. A method for forming n and p field effect transistors comprising:
   selecting a substrate having p and n regions for forming n and p field effect transistors respectively therein,
   forming a first gate dielectric and a first poly silicon gate electrode having sidewalls there over on at least one p region,
   forming a second gate dielectric and a second poly silicon gate electrode having sidewalls there over on at least one n region,
   forming a first mask over said second gate dielectric, said second poly silicon gate electrode and said n region,
   forming a tensely stressed film over said first poly silicon gate electrode,
   etching said tensely stressed film to provide a tensely stressed spacer on said sidewalls of said first poly silicon gate electrode,
   forming an n type halo region in said p region on opposite sides of said first poly silicon gate electrode,
   forming an n type source and drain extension in said p region overlapping said n type halo regions on opposite sides of said first poly silicon gate electrode,
   removing said first hard mask,
   forming a second mask over said p region, n type source and drain extensions, n type halo regions, tensely stressed spacers, and first poly silicon gate electrode,
   forming a compressively stressed film over said second poly silicon gate electrode,
   etching said compressively stressed film to provide a compressively stressed spacer on said sidewalls of said second poly silicon gate electrode,
   forming a p type halo region in said n region on opposite sides of said second poly silicon gate electrode,
   forming a p type source and drain extension in said n region overlapping said p type halo regions on opposite sides of said second poly silicon gate electrode, and
   removing said second mask.

2. The method of claim 1 wherein said forming a tensely stressed film includes forming said tensely stressed film directly on exposed sidewalls of said first poly silicon gate electrode.

3. The method of claim 1 wherein said forming a tensely stressed film includes forming said tensely stressed film on said first poly silicon gate electrode at an interface of said first gate dielectric.

4. The method of claim 1 wherein said forming a tensely stressed film includes forming said tensely stressed film on said first poly silicon gate electrode and abutting said p region.

5. The method of claim 1 further including forming an oxide layer having a thickness in the range from 0.5 to 5 nm on sidewalls of said first poly silicon gate electrode prior to forming said tensely stressed film.

6. The method of claim 1 wherein forming a first poly silicon gate electrode includes forming a gate electrode selected from the group consisting of SiGe, SiC, Ge, GaAs, combinations thereof and in combination with poly silicon.

7. The method of claim 1 wherein said forming a first mask includes forming a hard mask.

8. The method of claim 1 wherein said forming a compressively stressed film includes forming said compressively stressed film directly on exposed sidewalls of said second poly silicon gate electrode.

9. The method of claim 1 wherein said forming a compressively stressed film includes forming said compressively stressed film on said second poly silicon gate electrode at an interface of said second gate dielectric.

10. The method of claim 1 wherein said forming a compressively stressed film includes forming said compressively stressed film on said second poly silicon gate electrode and abutting said p region.

11. The method of claim 1 further including forming an oxide layer having a thickness in the range from 0.5 to 5 nm on sidewalls of said second poly silicon gate electrode prior to forming said compressively stressed film.

12. The method of claim 1 wherein forming a second poly silicon gate electrode includes forming a gate electrode selected from the group consisting of SiGe, SiC, Ge, GaAs, combinations thereof and in combination with poly silicon.

13. The method of claim 1 further including:
   forming a dielectric layer over and above said p and n regions including said first and second poly silicon gate electrodes,
   planarizing said dielectric layer down to said first and second poly silicon gate electrodes, and
   contacting said first and second gate electrodes and said source and drain extensions of said n and p field effect transistors.

* * * * *